United States Patent [19]
Ahn et al.

[11] 3,957,552
[45] May 18, 1976

[54] METHOD FOR MAKING MULTILAYER DEVICES USING ONLY A SINGLE CRITICAL MASKING STEP

[75] Inventors: Kie Y. Ahn, Chappaqua; Michael Hatzakis, Ossining; John V. Powers, Shenorock, all of N.Y.

[73] Assignee: International Business Machines Corporation, Armonk, N.Y.

[22] Filed: Mar. 5, 1975

[21] Appl. No.: 555,645

[52] U.S. Cl. .................................. 156/11; 29/578; 96/36; 340/174 R; 427/43; 427/131; 427/259; 427/264; 427/265
[51] Int. Cl.² .......................................... C23F 1/04
[58] Field of Search ................ 29/578; 96/36, 36.2; 156/3, 8, 11, 12, 17; 427/43, 130, 131, 259, 264, 265, 272, 282, 287; 340/174, 174 R

[56] References Cited
UNITED STATES PATENTS

| | | | |
|---|---|---|---|
| 2,728,693 | 12/1955 | Cado | 156/8 |
| 3,192,136 | 6/1965 | Reid | 204/11 |
| 3,700,445 | 10/1972 | Croson | 96/36.2 |
| 3,837,907 | 9/1974 | Berglund et al. | 156/17 |

*Primary Examiner*—William A. Powell
*Assistant Examiner*—Brian J. Leitter
*Attorney, Agent, or Firm*—Jackson E. Stanland

[57] ABSTRACT

A method for making multilayer devices, such as magnetic bubble domain devices, which are comprised of a plurality of layers that are deposited using only a single critical masking step. A first metallic layer is deposited on a substrate including a magnetic bubble domain film, which may or may not have a nonmagnetic material thereon. A first resist layer is then applied, selectively exposed, and developed to expose at least two areas of the first metallic film. A thicker metallic layer is then deposited in the exposed areas, or is electroplated. After this, another resist layer is applied without deforming the pattern in the first layer, selectively exposed, and developed to protect certain areas of the thick metallic layer from subsequent formation of another metallic layer. During this subsequent formation, a second metallic film is formed using the first resist layer as a mask. After this, the resists are removed and the now uncovered portions of the original thin metallic layer are etched away. In a particular embodiment, a magnetic bubble domain chip is provided in which the second resist layer is used to protect the sensor region of the chip. The second resist layer need not be critically aligned as it only functions as a protect mask. Exposure and development of the second resist layer does not adversely affect the underlying metal layers.

14 Claims, 6 Drawing Figures

METHOD FOR MAKING MULTILAYER DEVICES USING ONLY A SINGLE CRITICAL MASKING STEP

BACKGROUND OF THE INVENTION

1. Field of the Invention

This invention relates to the fabrication of microelectronic devices, and more particularly the fabrication of magnetic bubble domain chips having multiple magnetic films thereon which can be provided by a process having only a single critical masking step.

2. Description of the Prior Art

In the fabrication of microelectronic devices, such as semiconductor devices and bubble domain devices, it is frequently necessary to form multiple layers of material which must be in accurate alignment with one another. For instance, in the fabrication of magnetic bubble domain devices, it is often necessary that the conductor layers be precisely aligned with propagation layers used to move magnetic bubble domains in the magnetic material. For instance, reference is made to an IBM Technical Disclosure Bulletin article, appearing in Volume 15, No. 6, November 1972, at page 1826. In that article, a plurality of masking steps and alignments are used to provide the final device structure.

In the bubble domain art, attempts have been made to provide improved fabrication processes which will not require extensive use of high resolution masks and which will not require multiple masking steps where critical alignments must be maintained. For instance, A. H. Bobeck et al describes such a process in IEEE Transactions on Magnetics, Volume MAG-9, No. 3, September 1973, at page 474. In the process of Bobeck et al, single level metallurgy for producing bubble domain devices is described. In particular, a shadow mask is used to protect the sensor area of the bubble domain chip during deposition of the conductor layers which are used for various device functions and for providing current to the sensor. However, the use of a shadow mask is disadvantageous when full wafer processing and small magnetic bubble domain sensors are utilized.

Accordingly, the present invention provides an improved process in which all functions of the bubble domain chip can be provided using only a single critical masking step. These various functions of a complete magnetic chip are described in U.S. Pat. No. 3,701,125 to Chang et al. They include reading, writing, propagation (storage), transfer, and/or annihilation. As can be seen by referring to the Chang et al patent, conductor lines are used for the individual bubble domain devices which perform these functions. For instance, a conductor line is used to bring current to the sensor element, which is conveniently a magnetoresistive sensor comprised of the same material as the material used to move bubble domains in the magnetic bubble domain film. A suitable material is NiFe where permalloy (a trademark of Alleghany Ludlum Corp.) is a particularly good example.

In the present method, the propagation circuitry and the conductor circuitry are deposited at different times, using the same masking layer. Here "deposition" includes any process for forming a layer of material, and includes such well known processes as electroplating, evaporation, sputtering, etc. During formation of the conductor layer, the sensor is protected by a coarsely aligned masking layer. This coarsely aligned masking layer can be removed later, and its alignment is not critical. Also, the use of such a masking layer provides a fabrication process which eliminates the need for a shadow mask, which is expensive. Additionally, shadow masks do not last for multiple deposition runs because of material buildup on the mask. Further, processing techniques using shadow masks do not lend themselves to the processing of large wafers and especially those having very small magnetic bubble domains. With such large wafers, many hundreds of sensors are scattered all over the wafer rather than being merely located along the edge of the bubble domain wafer. For such a magnetic chip, full wafer packaging is particularly desirable, and such packaging can be provided with the present invention but cannot be easily provided with processes using shadow masks.

Accordingly, it is an object of the present invention to provide a technique for fabricating microelectronic structures having multiple metallic layers, where said layers are formed using the same masking layer.

It is a further object of the present invention to provide an improved process for making magnetic bubble domain chips, using only a single critical masking step.

It is another object of the present invention to provide an improved process for making magnetic bubble domain chips where multiple resist layers are used, but in which removal of the resist layers does not adversely affect underlying metallization layers.

It is a still further object of the present invention to provide an improved process for making microelectronic devices in which shadow masks are not required.

BRIEF SUMMARY OF THE INVENTION

This invention provides a processing technique for making magnetic bubble domain devices and other microelectronic devices, especially those in which small sizes and low costs are required. Accurate location of multiple metallization layers is provided without requiring precise alignment of numerous masks and without requiring multiple high resolution masks.

In particular, selective metallization of a substrate with at least two metallic films (layers) is provided. A first metallic film is deposited and coated with a first resist layer which is then patterned by exposure and development in order to expose the first metallic layer in different areas. At this time, a second resist layer is provided over the entire substrate and this second resist layer is patterned by selective exposure and development. The second resist layer provides a mask which protects selected areas of the chip (such as the sensor areas) from subsequent metallization. After this, the second metallization film is deposited over the chip and the resist layers are removed. Thus, the second metallic layer is left only on the first metallic layer and is removed from other portions of the chip.

In a preferred embodiment, one of the metallization layers is a magnetically soft material used for magnetic bubble domain propagation while the other metallic layer is comprised of a nonmagnetic, electrically conductive material used for various bubble domain device functions, such as providing current to bubble domain sensors. In this case, the second resist layer protects the sensor from being coated with the conductor layer.

In the practice of this invention, the resist layers are comprised of materials which can be selectively exposed and developed to provide patterned layers without adversely affecting previously patterned layers. Thus, the resists may be photoresists which are exposable by light, or resists which are sensitive to electron beams or x-rays. Such resists are well known in the art, and examples of them will be provided hereinafter.

It should be noted that the second resist layer is used to provide a protective layer over portions of the underlying metallic layer which are not to be attacked during the processing steps. It has been found that the second resist layer can be exposed and developed in a manner which does not attack the underlying resist layer or the first metallic layer. Accordingly, the resolution and integrity of the first resist layer are maintained so that it can be used as a masking layer for deposition of the second metallic layer. Consequently, no critical alignment is needed for formation of the second metallic layer.

Other objects and features of the invention, as well as modifications obvious to those skilled in the art, will become apparent from the following description of the preferred embodiments, taken in conjunction with the accompanying drawings.

DETAILED DESCRIPTION OF THE PREFERRED EMBODIMENTS

Figure 1:
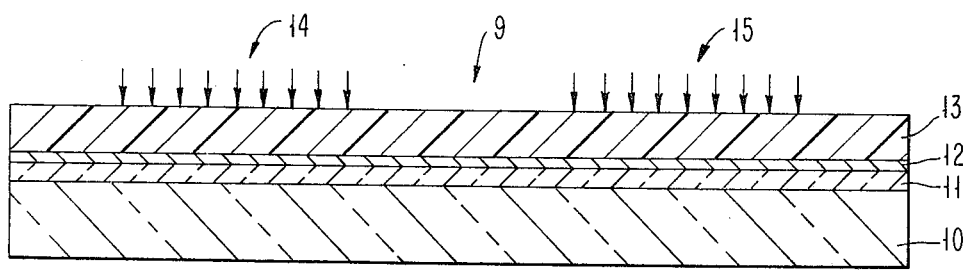
FIG. 1 is a side view of a partially fabricated magnetic bubble domain device to which the invention may be applied.

FIG. 1 shows a magnetic bubble device 9 with a conventional continuous magnetic bubble layer 10 (such as a garnet or amorphous magnetic material) deposited on a suitable substrate (not shown). A conventional spacer layer 11 (such as $SiO_2$) may be deposited on layer 10. Next, a thin film 12 of a metallic material, such as NiFe or Au, is deposited over the entire area of 11. Film 12 acts as a metallic conductor for the subsequent plating of a first metallization layer. Its thickness need only be great enough to provide adequate electrical conductance for this purpose. On the other hand, it should not be so thick that an etch to remove exposed areas of this layer will also remove significant amounts of subsequently deposited films. A convenient thickness for film 12 is on the order of 30 nanometers (nm), for the present application.

A layer 13 of positive resist is then coated on film 12. Many such resists are commercially available; polymethyl methacrylate (PMMA) is a suitable example of an electron beam resist. Layer 13 is exposed by conventional techniques, such as uv light, electron-beam or x-ray irradiation, to define sensor areas 14 and propagation areas 15. A high-resolution mask (not shown) may be employed for this purpose; precise alignment of this mask is not required. Although only one area of each type is illustrated, it will be understood that a single bubble domain chip will normally have many sensor areas 14 and many propagation areas 15.

Figure 2:
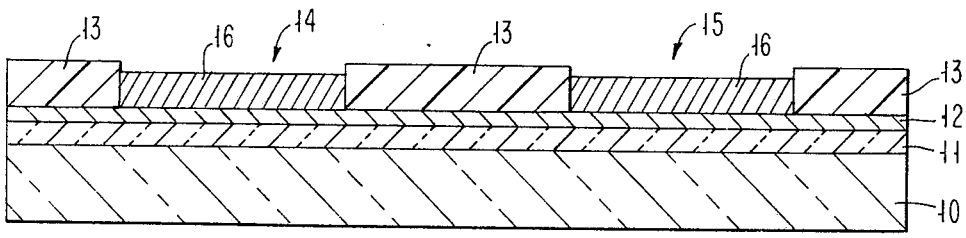
FIGS. 2–4 illustrate the performance of successive steps of the invention to the device of FIG. 1.

In FIG. 2, layer 13 has been fully developed, and the irradiated areas 14 and 15 have been washed away. An additional film 16 of magnetically soft material, such as NiFe, is then electroplated by known techniques onto film 12 in the uncovered areas 14 and 15. Film 16 is conveniently less than about 300 nm. thick, or up to about ten times as thick as the first film 12. In general, the thickness of film 16 is chosen to optimize device performance, and can be established by the device designer.

Figure 3:
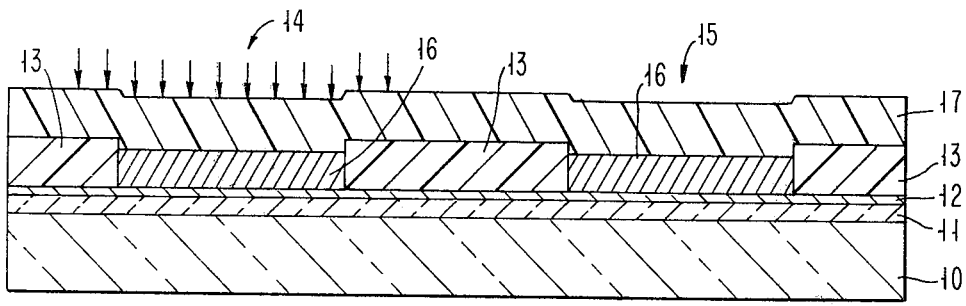

FIG. 3 shows a second layer 17 of resist coated on the entire surface of the structure of FIG. 2. Layer 17 is generally a conventional negative resist, such as KTFR (a trademark of Eastman Kodak), which is used to protect sensor areas 14 during subsequent metallization. It is irradiated by uv light, electron or x-ray beam only in the sensor areas 14. A low resolution mask (not shown) may be employed; again, exact alignment is not required, as long as the sensor is roughly protected.

Figure 4:
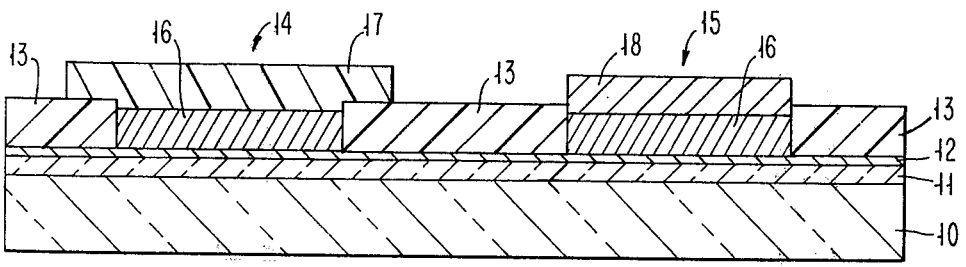
Figure 6:
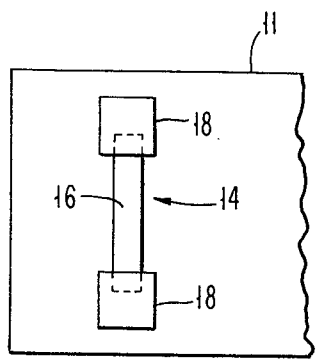
FIG. 6 is a top view of a sensor which is electrically contacted, viewed along line 6—6 as shown in FIG. 5.

In FIG. 4, the non-irradiated areas of resist 17 have been washed away after development. A metallic contact film 18 is then electroplated onto the now uncovered portions of metallic film 16. Since film 16 is fully uncovered in the non-sensor areas, the film 16 in these areas is fully overlaid by film 18. In sensor areas 14, electrical contact is easily provided by film 18 outside the actual sensor elements. Reference is made to FIG. 6 which shows the metallic layer 18 in electrical contact with the sensor 14, which was protected by resist 17 when contact layer 18 was deposited. Film 18 is composed of a material which has a high electrical conductivity, such as gold. Its thickness may conveniently be approximately 300 nm. thick, or as necessary. That is, it may have approximately the same thickness as film 16, and a much greater thickness than film 12. In general, contact layer 18 has a thickness which will provide good electrical conductivity without adverse effects due to electromigration, etc.

Layer 18 is a conductor layer that is used to provide current to the sensors 14, for transfer lines, generators, and annihilator. It is deposited using the same resist layer as was used for the first metallization layer (magnetic layer). In the practice of this invention, it has been discovered that the second resist layer can be deposited, exposed and developed to provide a sensor protect without adversely affecting the underlying resist layer 13, which has to be used for a second metallization.

Figure 5:
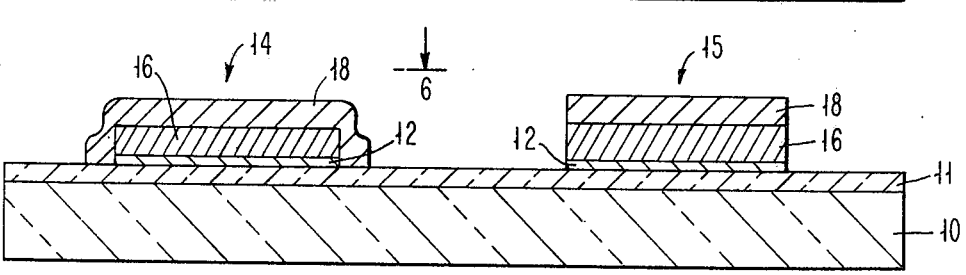
FIG. 5 shows a completed device constructed according to the present invention.

In FIG. 5, the remaining portions of resist layers 13 and 17 have been removed by a suitable solvent. An etching step, such as application of a chemical etchant, is then used on the entire structure for a time sufficient to remove film 12 from the now uncovered portions surrounding areas 14 and 15. Although this etchant may also remove some material from the surfaces of films 16 and 18, their relatively greater thickness leaves them substantially intact. As an alternative, upper film 18 can be protected during the etching step.

The completed structure of FIG. 5 has the high electrical conductivity layer 18 in areas 15, since the gold film 18 completely covers the NiFe 16 in those areas. Other parts of film 18 provide highly conductive contacts for sensor areas 14 (see FIG. 6) without degrading the desired high magnetic susceptibility characteristics of the NiFe film in the latter areas and without electrically shorting the sensor. Areas 14 and 15 have accurately defined locations relative to each other, without any need for precise alignment of a high resolution mask. Accurate alignment and high resolution are not required for the mask used to pattern the second resist layer 17, since layer 17 is used only for sensor protection and not for definition of areas 14 and 15.

Although layers 13 and 17 have been described as being of opposite types, namely positive and negative resists respectively, it is of course possible to employ the reverse combination or other combinations, with appropriate changes in the areas which are irradiated. For instance, resists 13 and 17 could be the same type of resists (both positive, or both negative) but care must be taken that the developer used for the second resist layer will not adversely attack the first resist layer, to expose undesired portions of the first metal layer 16. An example of the use of two positive resists is the use of positive AZ-1350 resist (trade name of the Shipley Co.) or its equivalents, for resist layer 17, together with PMMA as the first resist layer 13.

Instead of electroplating, films 16 and 18 could be evaporated by conventional techniques, if desired. However, this is not as advantageous as electroplating, since it is a lower yield step and would require high aspect ratios for the masking layers 13 and 17. Moreover, the thin film 12 need not be a magnetic material; it may be made of gold or other material if desired, since its function in this embodiment is to provide a plating base for formation of first metal layer 16.

Although the first metallic layer was shown as a magnetic layer, which could be used for such bubble domain functions as generation, propagation and annihilation, and the second metal layer 18 was shown as a conductor layer, such layers 16 and 18 could be deposited in reverse order to that shown herein.

What is claimed is:

1. A method for selectively metallizing a microelectronic device, comprising the steps of:
    a. depositing a first metallic film on said device;
    b. coating said device with a first resist layer;
    c. exposing and developing said first resist layer so as to uncover said first film in predetermined first and second areas of said device;
    d. depositing a second metallic film in said first and second areas;
    e. coating said device with a second resist layer;
    f. exposing and developing said second resist layer so as to expose said first area and to protect said second area from subsequent deposition;
    g. depositing a third metallic film onto said second film in said first area, said second area being protected during deposition of said third metallic film;
    h. removing said resist layers, thereby uncovering those portions of said first film not in said first or second areas; and
    i. removing said portions of said first film.

2. The method of claim 1, wherein said second and third films are deposited by electroplating.

3. The method of claim 2, wherein said first resist layer is exposed with a high resolution mask defining said first and second areas, and wherein said second resist layer is exposed with a lower resolution mask to protect said second area.

4. The method of claim 3, wherein said first and second resist layers are of opposite types.

5. The method of claim 2, wherein said portions of said first film are removed by exposing said device to an etchant.

6. The method of claim 5, wherein said second and third films are substantially thicker than said first film.

7. The method of claim 2, wherein said second film comprises a magnetic material.

8. The method of claim 7, wherein said third film comprises a substantially non-magnetic material.

9. The method of claim 7, wherin said first and second films are comprised of substantially the same material.

10. A method for fabricating a magnetic bubble domain device having a continuous layer of material capable of supporting magnetic bubble domains therein, said method comprising the steps of:
    a. depositing a first metallic film over said layer;
    b. coating said first film with a first resist layer;
    c. exposing said first resist layer to radiation through a first mask to define a sensor area and a propagation area;
    d. developing said first resist layer so as to expose said sensor and propagation areas;
    e. electroplating a second metallic film onto said first film in said sensor and propagation areas, said second film being substantially thicker than said first film;
    f. coating said second film and said first resist layer with a second resist layer;
    g. exposing said second resist layer to radiation through a second mask, said second mask having a resolution lower than that of said first mask;
    h. developing said second resist layer so as to leave said second resist layer on said sensor area;
    i. electroplating a third metallic film on said second film in said propagation area, said third film being substantially thicker than said first film;
    j. dissolving said first and second resist layers so as to expose a portion of said first film; and
    k. etching said first, second and third films until said portion of said first film has been removed.

11. The method of claim 10, wherein said first and second films comprise a magnetic material, and wherein said third film comprises a material having a high electrical conductivity.

12. The method of claim 10, wherein said first film is less than about 30 nm. thick, and wherein each of said second and third films is about ten times as thick as said first film.

13. A method for making a magnetic bubble domain chip having a substrate comprised of a magnetic bubble domain material and further including two metallization films, comprising the steps of:
    coating said substrate with a first resist layer and exposing and developing said resist layer to define a pattern of first and second areas,
    depositing a first metal film onto said first and second areas though said first resist layer,
    coating said first metal film and said first resist layer with a second resist layer and exposing and developing said second resist layer to expose said first metal film in said first area and to protect said first metal film from subsequent metal deposition in said second area,
    depositing a second metal film on said first metal film in said first area, using said patterned first and second resist layers to define the areas of deposition of said second metal film,
    removing said first and second resist layers and those portions of said first and second metal films which overlie said resist layers.

14. The method of claim 13, where said first metal film is comprised of a magnetic material and said second metal film is comprised of a non-magnetic electrical conductor.

* * * * *